(12) United States Patent
Lattard

(10) Patent No.: US 6,342,450 B1
(45) Date of Patent: Jan. 29, 2002

(54) METHOD OF FORMING INSULATING SPACERS IN DRAM CHIPS

(75) Inventor: Edith Lattard, Trets (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/607,215

(22) Filed: Jun. 30, 2000

(30) Foreign Application Priority Data

Jan. 7, 1999 (FR) .......................................... 99 480048

(51) Int. Cl.⁷ ............................................. H01L 21/311
(52) U.S. Cl. ...................... 438/696; 438/706; 438/738
(58) Field of Search ................................ 438/694, 696, 438/706, 738

(56) References Cited

U.S. PATENT DOCUMENTS

| | | | | |
|---|---|---|---|---|
| 5,923,986 A | * | 7/1999 | Shen | 438/303 |
| 6,121,098 A | * | 9/2000 | Strobl | 438/301 |
| 6,136,695 A | * | 10/2000 | Lee et al. | 438/637 |
| 6,165,857 A | * | 12/2000 | Yeh et al. | 438/303 |
| 6,194,302 B1 | * | 2/2001 | Shen | 438/597 |
| 6,268,637 B1 | * | 7/2001 | Gardner et al. | 257/522 |
| 6,277,700 B1 | * | 8/2001 | Yu et al. | 438/303 |
| 2001/0009805 | * | 7/2001 | Ha et al. | 438/637 |

* cited by examiner

Primary Examiner—Benjamin L. Utech
Assistant Examiner—Matthew A. Anderson
(74) Attorney, Agent, or Firm—Robert A. Walsh

(57) ABSTRACT

There is disclosed an improved method of forming the spacer which isolates the gate conductor from the metal contact with the diffusion (source/drain) region of each array transfer transistor for all memory cells of a DRAM chip. According to the method there is provided a structure consisting of a silicon substrate having a diffusion region formed therein and gate conductor (GC) lines formed thereon. Then, an oxynitride layer and a silicon nitride ($Si_3N_4$) layer are conformally deposited in sequence onto the structure by LPCVD in the same tool for total clusterization. Next, the structure is anisotropically dry etched with a chemistry that is $Si_3N_4$/oxynitride selective to expose the oxynitride layer between the GC lines and the upper portion thereof in a one step process to form the $Si_3N_4$ spacers. Still in accordance with the invention, the above method finds a valuable application in the fabrication of borderless metal contacts in DRAM chips wherein the risk of having potential an electrical short between the gate conductor and the metal contact is substantially eliminated.

6 Claims, 9 Drawing Sheets

METHOD OF FORMING INSULATING SPACERS IN DRAM CHIPS

FIELD OF THE INVENTION

The present invention relates to the manufacture of semiconductor integrated circuits (ICs) and more particularly to an improved method of forming the spacer which isolates the gate conductor from the metal contact with the diffusion (source/drain) region of each array transfer transistor for all memory cells of a DRAM chip. The formation of insulating spacers is essential in the fabrication of such metal contacts to prevent any gate conductor/source electrical short that would be detrimental to the DRAM chip reliability.

BACKGROUND OF THE INVENTION

In the manufacture of semiconductor integrated circuits and particularly in dynamic random access memory (DRAM) chips, the one-device memory cell is comprised of an array transfer transistor, typically an insulated gate field effect transistor (IGFET) and a storage capacitor. For each IGFET, the source is connected to a metal contact which is part of a bit line, the drain is connected to one electrode (node) of the storage capacitor and the gate conductor is the word line (runs orthogonal to the bit line). It is of paramount importance to make sure that there is no electrical short between the metal contact with the source region and the gate conductor. As a matter of fact, a total and reliable isolation is essential to the IGFET integrity and thus to the memory cell operation. Typically, the gate conductor consists of a polycide, i.e. a composite metal silicide/doped polysilicon structure (the preferred metal is tungsten so that the metal silicide has a WSix like formulation). This isolation is performed by a dedicated dielectric layer, usually of silicon nitride ($Si_3N_4$), which forms an insulating spacer on the gate conductor (GC) sidewall.

In the last generation of DRAM chips, due to scaling reduction effects, the process window is constantly reduced and consequently, there is a serious risk of exposing said gate conductor sidewall during the formation of the contact hole to expose the source region. Recently, a new contact hole structure named "borderless" and processes of efficiently making the same were developed in the semiconductor industry. These techniques are necessary to meet the modern reliability requirements of this industry to date. The new borderless contact hole structure requires the deposition of an oxynitride film which will be used as an etch stop and a barrier layer during the source contact hole formation. As a result, the gate conductor (word line) that was previously only laterally coated by said dedicated dielectric layer to form the insulating spacer is now totally encapsulated by said oxynitride layer to prevent any undesired exposition of the gate conductor when the contact hole exposing the source region is opened during subsequent photolithography and etch steps. Finally, the borderless contact hole is filled with a metal such as tungsten, to produce the so-called borderless metal (CB) contact.

Therefore, the production of borderless metal contacts is an absolute requirement for the 64 Mbits DRAM chips and follow-on generations. However, the fabrication process of a borderless metal contact represents a major challenge because it must: (1) ensure the lowest possible electrical resistance with the source region and (2) present none risk of a potential source region/gate conductor electrical short that would be detrimental to the DRAM chip functionality. In addition, a borderless metal contact must be formed according to a simple and affordable fabrication process.

A conventional borderless metal contact (CB) fabrication process including the insulating spacer formation is described hereinbelow in conjunction with FIG. 1 and FIGS. 2A–2F. All processing steps are conducted in the so-called MEOL module (MEOL stands for Middle End Of the Manufacturing Line). It is important to point out that the illustrated layers in the drawings are not necessarily drawn to scale.

FIG. 1 schematically illustrates the initial structure referenced 10 which basically consists of a P-type doped silicon substrate 11 coated with a 4.5 nm thick silicon oxide ($SiO_2$) gate layer 12. In the substrate 11, two storage capacitors in their respective trenches are shown. On said $SiO_2$ gate layer 12, a composite insulating/conductive/insulating film has been formed. For instance, it is comprised of a bottom 100 nm thick phosphorus doped polysilicon layer 13, a 55 nm thick tungsten silicide (WSix) layer 14, and a 200 nm thick silicon nitride ($Si_3N_4$) capping layer 15. After thermal treatments, the doped polysilicon and the tungsten silicide form a layer 13/14 of the polycide material mentioned above. Gate conductor (GC) lines 16 are formed by patterning these three layers using a conventional dry etch process, so that each gate conductor line 16 includes a $Si_3N_4$ cap still referenced 15. Finally, a 14 nm thick thermal oxide layer 17 laterally passivates the polycide layer 13/14 to prevent any spurious oxidation during the following thermal steps. As apparent in FIG. 1, there is shown a diffusion region 18, typically the source of an IGFET.

Now, referring to FIG. 2A, the conventional borderless metal contact fabrication process starts with the conformal deposition by LPCVD of a $Si_3N_4$ layer 19 having a thickness of about 30 nm onto the structure 10 top surface. For instance, the $Si_3N_4$ material of layer 19 can be deposited in a TEL Fast Thermal Ramp, a tool manufactured by TOKYO ELECTRON LTD, Tokyo, Japan using a $NH_3$/DCS (dichlorosilane) chemistry and the process parameters recited below.

| | |
|---|---|
| Pressure: | 150 mTorr |
| Temperature: | 780° C. |
| $NH_3$ Flow: | 250 sccm |
| DCS flow: | 50 sccm |
| Duration: | 16 min |

The target is to obtain this thickness of about 30 nm both on the top and the sidewall of gate conductor lines 16 (measured on a product wafer).

After $Si_3N_4$ material deposition, an anisotropic dry etching step is then performed to form the $Si_3N_4$ spacers. The etch step is stopped as soon as the $SiO_2$ gate layer 12 top surface is exposed. For instance, this step may be conducted in the MxP+ chamber of an AME 5200 tool, commercially available from Applied Materials, Santa Clara, Calif., USA, for instance, with the following operating conditions:

| | |
|---|---|
| Pressure: | 50 mTorr |
| Power: | 100 W |
| Temp. (Wall/Cath.): | 15/15° C. |
| He Cooling: | 26 Torr |
| $CHF_3$ Flow: | 28 sccm |
| $O_2$ Flow: | 6 sccm |

| | |
|---|---|
| $CO_2$ Flow: | 75 sccm |
| Ar Flow: | 50 sccm |
| Duration: | 75 s |

Spacers referenced 19 are shown in FIG. 2B.

This dry etch step is monitored in-situ by an optical etch endpoint technique ($N_2$ line) using an optical emission spectrometer. When the surface of the $SiO_2$ gate layer 12 between the gate conductor lines 16 is reached, the etching is stopped. Because of inherent characteristics of the $Si_3N_4$ deposition step described by reference to FIG. 2A, $Si_3N_4$ layer 19 is thicker at wafer edge than at wafer center inducing thereby a significant thickness non-uniformity across the wafer. Moreover, because of inherent characteristics of the $Si_3N_4$ etch step described by reference to FIG. 2B, this non-uniformity is further increased due to a higher etch rate at the wafer center than at the wafer edge. As a consequence, the $SiO_2$ gate layer 12 surface is reached first at wafer center. Therefore, a large overetch is required to avoid $Si_3N_4$ residues remaining onto the $SiO_2$ gate layer 12 at the wafer edge. During this $Si_3N_4$ layer 19 overetch step, $Si_3N_4$ cap 15 is eroded at wafer center inducing thereby a large range on the $Si_3N_4$ cap 15 thickness across the wafer surface. After overetch, it is essential that $SiO_2$ gate layer 12 remains above the diffusion regions 18 that are exposed as illustrated in FIG. 2B without $Si_3N_4$ residues at the bottom corner of the $Si_3N_4$ spacer 19 and without an erosion at the $Si_3N_4$ cap 15 top corner. $SiO_2$ gate layer 12 remains after $Si_3N_4$ layer 19 etch thanks to a chemistry that has a $Si_3N_4$ etch rate two times faster than the etch rate.

At this stage of the CB formation process, the wafer is submitted to a thickness measurement using an ellipsometer. Such a measurement is needed to evaluate $Si_3N_4$ cap 15 and $SiO_2$ gate layer 12 remaining thickness and uniformity. It is followed by a standard FM (foreign material) inspection on the product wafer. Finally, a cleaning step is performed in a DNS wet bench, a tool manufactured by Dai Nippon Screen, Japan using a conventional wet process (desionized water rinse combined with ultrasonic waves).

Once, the insulating sidewall spacer 19 has been formed for gate conductor line 16 dielectric encapsulation, the wafer is pre cleaned using a Huang solution, performed in a CFM, a tool manufactured by Continuous Flow Machine Inc., West Chester, USA using the following conditions:

| | | |
|---|---|---|
| SC1: $H_2O/NH_4OH/H_2O_2$: | 80:1.3:3.1 (in volume) | time: 2 min |
| $H_2O$ flow (rinse): | 3 gallons/min | time: 1 min |
| SC2: $H_2O/HCl/H_2O_2$: | 80:2.2:3.1 (in volume) | time: 2 min |
| $H_2O$ flow (rinse): | 3 gallons/min | time: 1 min |
| Temperature: | 35° C. | |

This step is followed by the conformal deposition of a silicon oxynitride layer which coats structure 10 top surface. This oxynitride layer has the double role of an etch stop layer and a diffusion barrier.

Now referring to FIG. 2C, the oxynitride material forming layer 20 is deposited in the TEL FTR reactor mentioned above using a $NH_3/N_2O/DCS$ chemistry according to the process parameters recited below.

| | |
|---|---|
| Pressure: | 250 mTorr |
| Temperature: | 770° C. |
| $NH_3$ flow: | 90 sccm |
| $N_2O$ flow: | 450 sccm |
| DCS flow: | 135 sccm |
| Duration: | 47 min |

The target is to obtain a thickness of about 23 nm atop the structure 10 surface (measured on a product wafer).

Next, the passivation inter-level dielectric (ILD) material, typically a boro-phospho-silicate-glass (BPSG), is deposited by LPCVD at 850° C. in a LAM 9800 plasma reactor, sold by LAM RESEARCH, Fremont, Calif., USA, to form layer 21 which is used to fill the spaces between the gate conductor lines 16. The chemistry is a tri-ethyl-borate (TEB)/tetra-ethyl-ortho-silicate (TEOS)/$O_2$ mixture with $N_2$ as the carrier gas as standard. The BPSG material is defined by its boron and phosphorous concentrations equal to 4.5% each. Structure 10 is then in-situ reflow annealed at 850° C. for 20 minutes to prevent void generation.

The target is to obtain a thickness of the BPSG layer 21 above diffusion region 18 of about 65 nm (measured on a product wafer).

The BPSG material of layer 21 is planarized by chemical-mechanical polishing in a EBARA polisher CEP 022, a tool manufactured by Precision Machinery Group, Tokyo, Japan with the following conditions:

| | |
|---|---|
| Pad: | IC 1000 Suba IV manufactured by Rodel Inc., USA |
| Slurry: | SC1 supplied by Cabot Inc., USA |
| Polish time: | 60 s |

The thickness control is performed in-situ. The resulting structure is shown in FIG. 2D. This step is followed by a cleaning performed to reduce contamination, for instance, in the CFM tool mentioned above and with the same operating conditions.

Now, referring to FIG. 2E, a TEOS $SiO_2$ layer 22 is deposited onto the structure 10. Typically this deposition is performed by PECVD for instance in an AME 5000 plasma reactor still of APPLIED MATERIALS using a TEOS//$O_2N_2$ chemistry as standard. Following operating conditions are adequate.

| | |
|---|---|
| TEOS flow: | 1000 mg/min |
| $O_2$ flow: | 1000 sccm |
| $N_2$ flow: | 1200 sccm |
| Power: | 675 W |
| Pressure: | 8.2 Torr |
| Temperature: | 400° C. |

The target is to obtain a thickness of about 510 nm atop the structure 10 surface (measured on a product wafer). The wafer is cleaned in a FSI spray tool, a tool manufactured by Fluoroware System Inc., Minneapolis, USA, using the conditions recited below:

| | | |
|---|---|---|
| SP:H$_2$SO$_4$/H$_2$O$_2$ | 4:1 | T = 85° C. |
| SC1:H$_2$O/NH$_4$OH/H$_2$O$_2$ | 1:1:7.5 | T = 50° C. |
| SC2:H$_2$O/HCl/H$_2$O$_2$ | 1:1:7.5 | T = 50° C. |
| Duration | 2 min (for each step) | |

This step is followed by a reflow anneal at 950° C. for 10s in a N$_2$ atmosphere.

Borderless contact hole locations will be defined thanks to a photoresist mask comprised of a dual BARL (bottom anti-reflective layer)/photoresist layer as standard. For instance, a 90 nm thick AR3 resist manufactured by Shipley, Malborough, Mass., USA, and a 625 nm M10G resist manufactured by Japan Synthethic Rubber, Tokyo. Japan are successively deposited in a TEL ACT8, a tool manufactured by Tokyo Electron LTD, Tokyo, Japan. Then, the photoresist layer is exposed in a Micrascan III, a tool manufactured by Silicon Valley Group (SVG), Wilton, Conn., USA according to the desired mask pattern and developed in said TEL ACT8 tool. Overlay and contact dimensions are checked, dimensions of openings in the photomask are centered around 255 nm. The borderless contact hole is now formed by an anisotropic etch down to the diffusion region 18 in silicon substrate 11 according to a sequence of four steps that are all performed in the same chamber of the dry etcher, so that it is a fully integrated process. These four steps include etching of the BARL layer (not shown in FIG. 2E), TEOS SiO$_2$ layer 22, BPSG layer 21, the oxynitride layer 20 and the SiO$_2$ layer 12. For instance, these four steps can be sequentially conducted in a TEL 85 DRM, a plasma etcher manufactured by Tokyo Electron Ltd. The operating conditions recited below are adequate.

| BARL ETCH | |
|---|---|
| Pressure: | 17 mTorr |
| Temperature: | 60° C. |
| Power: | 120 W |
| CO flow: | 30 sccm |
| flow: | 20 sccm |
| N$_2$ flow: | 100 sccm |
| Ar flow: | 50 sccm |
| Duration: | 60 s |
| TEOS SiO$_2$ ETCH | |
| Pressure: | 44 mTorr |
| Temperature: | 60° C. |
| Power: | 1700 W |
| CO flow: | 50 sccm |
| Ar flow: | 200 sccm |
| C4F8 flow: | 14 sccm |
| Duration: | 50 s |
| BPSG ETCH | |
| Pressure: | 51 mTorr |
| Temperature: | 60° C. |
| Power: | 1700 W |
| CO flow: | 300 sccm |
| Ar flow: | 380 sccm |
| C4F8 flow: | 14 sccm |
| Duration: | 90 s |
| OXYNITRIDE/ETCH | |
| Pressure: | 40 mTorr |
| Temperature: | 60° C. |
| Power: | 500 W |
| flow: | 20 sccm |
| N$_2$ flow: | 180 sccm |
| flow: | 10 sccm |
| Duration: | 15 s |

This dry etch step sequence is controlled by time. Now, the contact hole is first coated with a Ti-N liner, then filled with a metal such as tungsten as standard. This terminates the borderless metal contact (CB) fabrication process. The final structure is shown in FIG. 2F, where the borderless metal contact bears numeral 23.

Oxynitride layer 20 must withstand the process of etching the borderless contact hole through the BPSG layer 21 to expose diffusion region 18 while preserving the Si$_3$N$_4$ cap 15 integrity. The etch chemistry is adapted to remove the oxynitride etch stop layer 20. The oxynitride layer 20 thickness is limited by aspect ratio and contact resistance requirements to less than 23 nm. The TEOS SiO$_2$ and BPSG etch steps require a selectivity greater than 6:1 on topographical as well as on planar surfaces of structure 10 to ensure Si$_3$N$_4$ spacer 19, Si$_3$N$_4$ cap 15 and oxynitride layer 20 integrity. The chemistry of the last etch step is adapted to remove the oxynitride material of oxynitride layer 20 without any silicon oxide or oxynitride residues.

This four-step dry etch process which forms the borderless contact hole is very critical and complex. Consequently, the conventional borderless metal contact fabrication process described by reference to FIGS. 2A to 2F as a whole suffers from three inherent main concerns that are listed below.

1. There is an erosion of the Si$_3$N$_4$ cap 15 during the Si$_3$N$_4$ spacer 19 etch step described by reference to FIG. 2B, because their constituting materials are very similar. In turn, this erosion causes important variations in the specified Si$_3$N$_4$ cap 15 thickness across the wafer after BPSG planarization by chemical-mechanical polishing.

2. TEOS SiO$_2$ and BPSG dry etch steps are controlled by a fixed time which is determined for all the wafers of a batch and for all the batches. This time is set large enough to avoid any potential risk of electrical shorts. The lack of an accurate monitoring of the etch stop layer during borderless contact hole formation process is detrimental in terms of contact resistance for the CB fabrication process reliability because any Si$_3$N$_4$ cap, BPSG and TEOS layers thickness non-uniformity cannot be detected and thus compensated.

3. As known for those skilled in the art, the above described BPSG dry etch step is essentially BPSG:Si$_3$N$_4$ selective, so that an undesired etching of the oxynitride layer 20 is performed during this step which in turn will unfavorably affect the subsequent step of filling the contact holes with metal by creating a potential risk of electrical shorts. Tungsten contacts 23 might come in contact with the polycide of layer 14/14 on the gate conductor line sidewall, as a result of oxynitride material removal.

Note that, as far as the first point is concerned, the etch stop layer is the SiO$_2$ gate layer 12, so that during Si$_3$N$_4$ spacer layer 19 overetch, due to low uniformity of this spacer formation process, the SiO$_2$ of the gate layer 12 and the Si$_3$N$_4$ of the cap layer 15 are consumed (e.g. 50 Å for SiO$_2$ and 200 Å for Si$_3$N$_4$). Therefore, BPSG layer 21 planarization by chemical-mechanical polishing must take in account this non-uniformity that is induced on the Si$_3$N$_4$ cap 15 thickness across the wafer surface. This step must ensure that at the end of the planarization step, the top of the Si$_3$N$_4$ cap 15 of each gate conductor line is reached. As a consequence, a maximum duration time is selected to securely obviate this non-uniformity problem.

In view of these considerations and because the aspect ratio of the contact hole is high and of the etch time is determined (see point 2), a permanent control of product wafers is necessary, with all the known related inconveniences.

As to the third point, the erosion of the $Si_3N_4$ cap 15 which reduces its thickness during borderless contact hole formation process, leads to a high risk of electrical short generation between the gate conductor and the CB metal contact during the subsequent step of metal filling. Furthermore, due to the low oxynitride/$SiO_2$ selectivity of CB dry etch process, the oxynitride material of layer 20 which protects the gate conductor sidewall is completely etched during this process, so that the physical barrier consisting of $Si_3N_4$ and oxynitride layers is reduced of the sole oxynitride layer causing thereby a serious increase of this risk of electrical shorts.

SUMMARY OF THE INVENTION

It is therefore a primary object of the present invention to provide an improved method of forming the insulating spacer on the gate conductor sidewall of each array transfer transistor of all memory cells of a DRAM chip.

It is another object of the present invention to provide an improved method of forming the insulating spacer in DRAM chips wherein the integrity and thickness uniformity of the $SiO_2$ gate and $Si_3N_4$ cap layers are preserved.

It is another object of the present invention to provide an improved method of forming the insulating spacer in the course of fabricating the borderless metal contact with the diffusion region of each array transfer transistor of all memory cells of a DRAM chip.

It is still another object of the present invention to provide an improved method of fabricating the borderless metal contact in DRAM chips which allows to open all CB contact holes to expose diffusion regions with an absolute certainty eliminating thereby the risk of electrical shorts.

It is still another object of the present invention to provide an improved method of fabricating the borderless metal contact in DRAM chips which allows to open all CB contact holes to expose diffusion regions with an absolute certainty maintaining thereby manufacturing yields at a high and constant level.

It is still another object of the present invention to provide an improved method of fabricating the borderless metal contact in DRAM chips wherein the $Si_3N_4$ cap layer thickness can be reduced because there is no erosion of the $Si_3N_4$ material during spacer formation, so that the aspect ratio of the metal contact is reduced.

It is still another object of the present invention to provide an improved method of fabricating the borderless metal contact in DRAM chips which reduces the number of processing steps.

The accomplishments of these and other related objects is first achieved by the improved method of forming the insulating spacer on the gate conductor sidewall according to the present invention which comprises the steps of:

a) providing a structure consisting of a silicon substrate having a diffusion region formed therein and gate conductor (GC) lines formed thereon isolated from the substrate by a thin $SiO_2$ gate layer;

b) conformally depositing an oxynitride layer and a silicon nitride ($Si_3N_4$) layer in sequence onto the structure in the same deposition tool for total clusterization; and, c) anisotropically dry etching the $Si_3N_4$ layer with a chemistry which is $Si_3N_4$/oxynitride selective to expose the oxynitride layer between the GC lines and the upper portion thereof in a one step process to form the $Si_3N_4$ spacers.

In addition, the present invention also encompasses the improved method of fabricating the borderless metal contact with a diffusion region in a silicon substrate relying on this insulating spacer formation which comprises the steps of:

a) providing a structure consisting of a silicon substrate having a diffusion region formed therein and gate conductor (GC) lines formed thereon isolated from the substrate by a thin $SiO_2$ gate layer;

b) conformally depositing an oxynitride layer and a silicon nitride ($Si_3N_4$) layer in sequence onto the structure in the same deposition tool for total clusterization;

c) anisotropically dry etching the $Si_3N_4$ spacer layer with a chemistry which is $Si_3N_4$/oxynitride selective to expose the oxynitride layer between the GC lines and the upper portion thereof in a one step process to form the $Si_3N_4$ spacers;

d) monitoring said dry etch step with a spectrometer to use the oxynitride layer as an etch stop layer;

e) depositing a layer of BPSG material in excess onto the structure;

f) planarizing the BPSG material by chemical-mechanical polishing to remove the BPSG down to approximately the oxynitride layer surface on the top of the GC lines;

g) depositing a passivating layer of TEOS $SiO_2$ onto the structure;

h) defining a photolithography mask to expose contact hole locations;

i) anisotropically dry etching the TEOS, BPSG, oxynitride and $SiO_2$ materials to expose the diffusion region to form the contact hole; wherein the operating conditions of the BPSG etch step ensures a high selectivity to etch the BPSG at least 6 times faster than the $Si_3N_4$ of the spacer layer; and, j) depositing a metal to fill the contact hole and create the borderless metal contact.

The above method has significant advantages in terms of product reliability (lower contact resistance, larger process windows, . . . ), throughput improvements and process flow simplification.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF A PREFERRED EMBODIMENT

Figure 1:
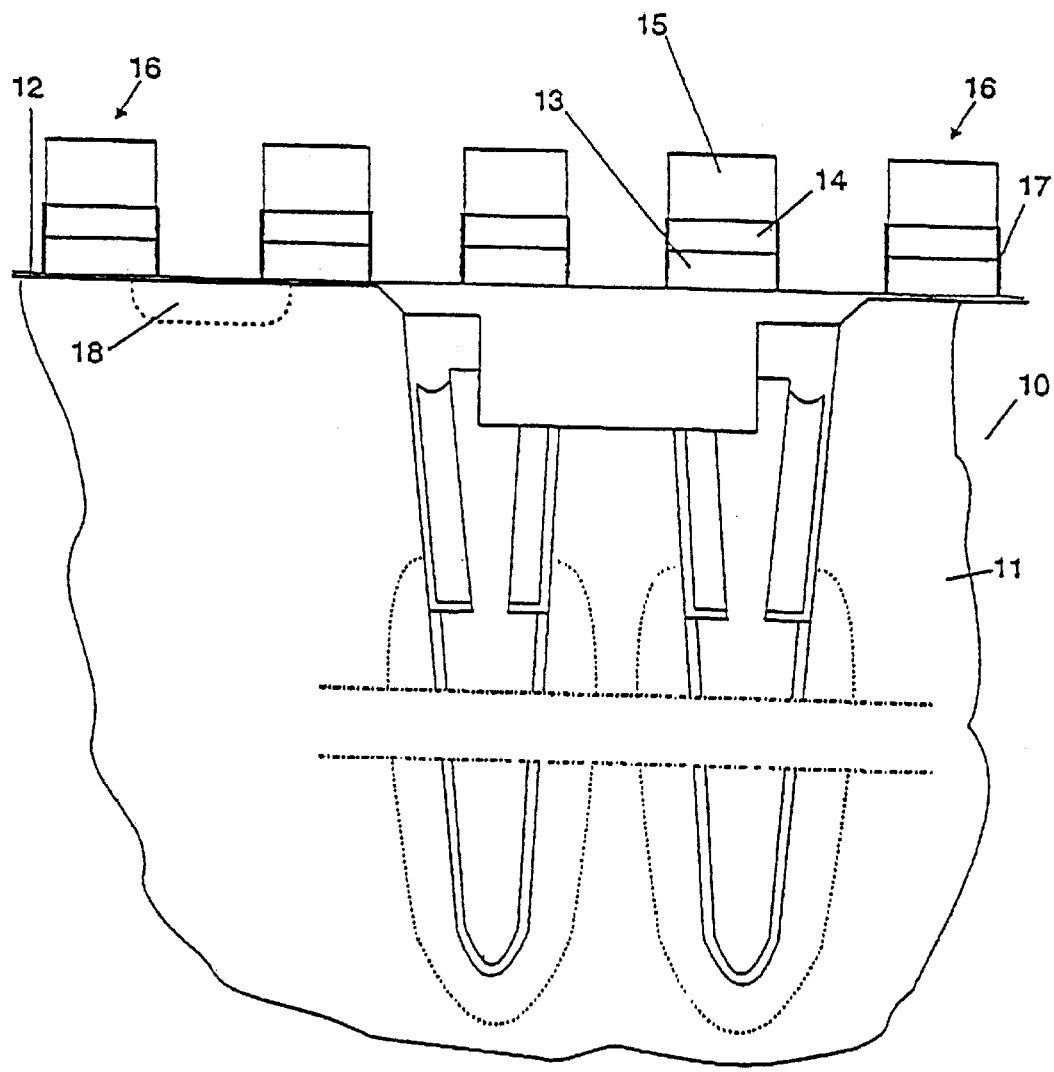
FIG. 1 shows the semiconductor structure at the initial stage of the borderless metal contact fabrication process.

The essential steps of the improved borderless contact fabrication process in accordance with the present invention will be briefly described by reference to FIGS. 3A to 3D. Like reference numerals are used through the several drawings to designate identical parts. The initial structure is still the structure depicted in FIG. 1.

In essence, a bottom oxynitride layer and atop $Si_3N_4$ layer are conformally deposited in-situ by a two-step LPCVD process onto structure 10. Therefore, according to an essential feature of the present invention, with respect to the conventional fabrication process described above by reference to FIGS. 2A–2F, the deposition order of the two layers has been changed to minimize the detrimental effects recited above. Still pursuant to the present invention, these two steps are performed in the same tool allowing thereby a fully clusterized process. The thickness and reflective/absorption indices of said layers are monitored on a blanket wafer after each LPCVD run.

Figure 3A:
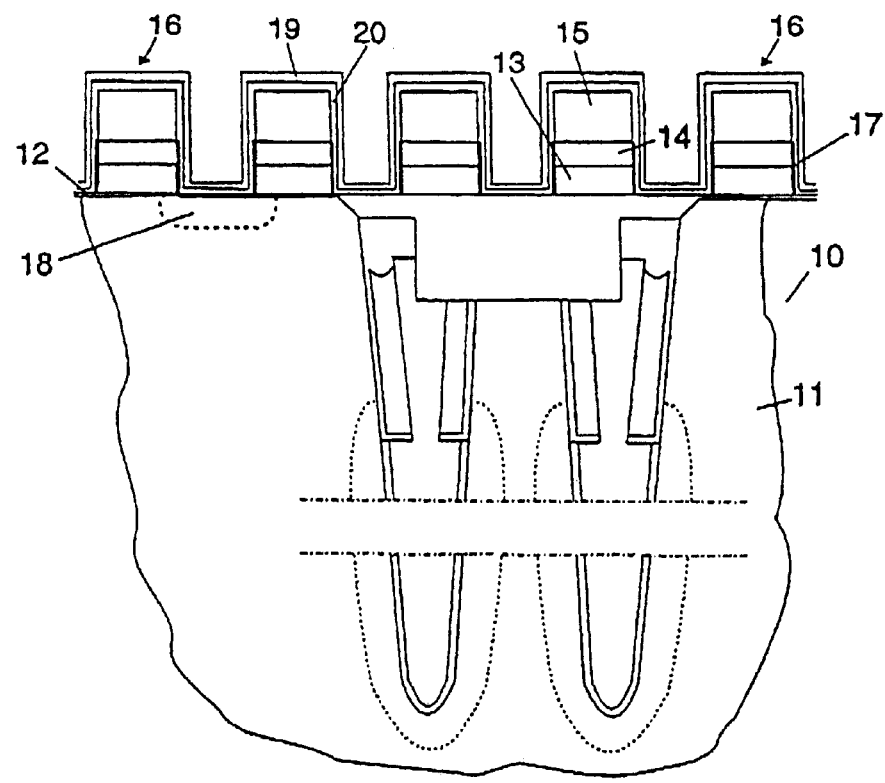
FIGS. 3A, 3B, 3C, and 3D show the structure of FIG. 1 undergoing the essential steps of the borderless contact metal fabrication process according to the method of the present invention.

Referring now to FIG. 3A, the first step is used to deposit the oxynitride material onto the gate conductor lines 16 to form layer 20, which is thus directly in contact with the $SiO_2$ gate layer 12. The second step is used to deposit the $Si_3N_4$ material to form layer 19 onto oxynitride layer 20. The target is still to obtain the same thicknesses, i.e. of about 23 nm for oxynitride layer and 30 nm for $Si_3N_4$ layer atop the structure 10 surface. Therefore, the total thickness of these two layers on the GC line sidewall is equal to 53 nm. This represents the thickness of the physical barrier that aims to prevent phosphorous atoms (of the BPSG material) to migrate into substrate 11. For instance, oxynitride layer 20 and $Si_3N_4$ layer 19 can be deposited by LPCVD in the TEL FTR tool mentioned above using the following process parameters.

| Oxynitride deposition | |
|---|---|
| Pressure: | 250 mTorr |
| Temperature: | 780° C. |
| $NH_3$ flow: | 90 sccm |
| $N_2O$ flow: | 450 sccm |
| DCS flow: | 135 sccm |
| Duration: | 47 min |
| $Si_3N_4$ deposition | |
| Pressure: | 150 mTorr |
| Temperature: | 780° C. |
| $NH_3$ flow: | 250 sccm |
| DCS flow: | 135 sccm |
| Duration: | 16 min |

It is important to notice that the same temperature is used for the two deposition steps.

The etching of the $Si_3N_4$ material of layer 19 is now performed. This step is used to etch the $Si_3N_4$ material on the top of the structure 10 and etching is stopped when the underlying oxynitride layer 20 is reached on all wafer surface (detected by an optical spectrometer as standard). During overetch, no erosion of the $Si_3N_4$ cap 15 and $SiO_2$ gate layer 12 is produced because they are protected by the oxynitride material. As a result, the $Si_3N_4$ cap layer 15 and $SiO_2$ gate layer 12 thickness obtained after gate conductor lines etch and sidewall oxidation steps respectively are maintained within the specifications. The $Si_3N_4$ etch process does not contribute any more to thickness non-uniformity between wafer center and edge for these two layers. The oxynitride layer 20 has an uniform thickness across the wafer surface thanks to $Si_3N_4$/oxynitride etch process characteristics. This etch process is performed in the same MxP+ chamber of the AME 5200 tool RIE reactor and with the same operating conditions of the corresponding step of the conventional fabrication process described above by reference to FIG. 2B except in that the duration is now equal to 68 s.

Figure 3B:
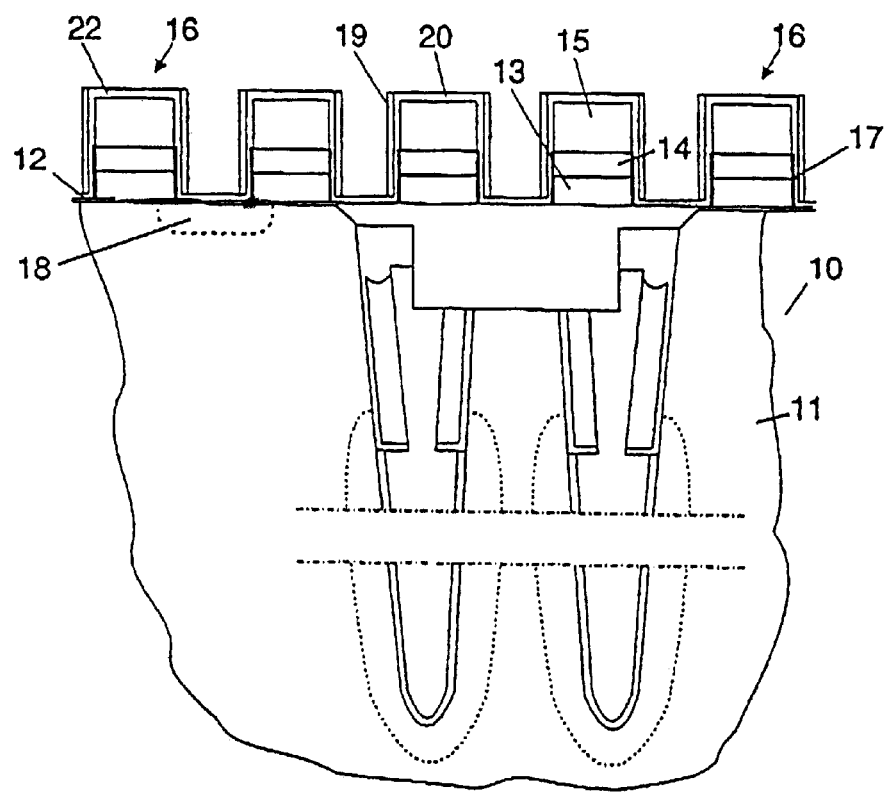

The resulting structure is shown in FIG. 3B. Because, the etch chemistry presents the same oxynitride:$Si_3N_4$ and $SiO_2$:$Si_3N_4$ selectivity, the oxynitride etch stop layer 20 isn't altered. So that $Si_3N_4$ cap layer 15 presents no erosion and the $SiO_2$ gate layer 12 is not damaged. As a consequence, spacer 19 profile is improved in the same way. The measurement step done in the conventional process to evaluate $Si_3N_4$ cap layer and $SiO_2$ gate layer thickness losses is no longer necessary.

Figure 3C:
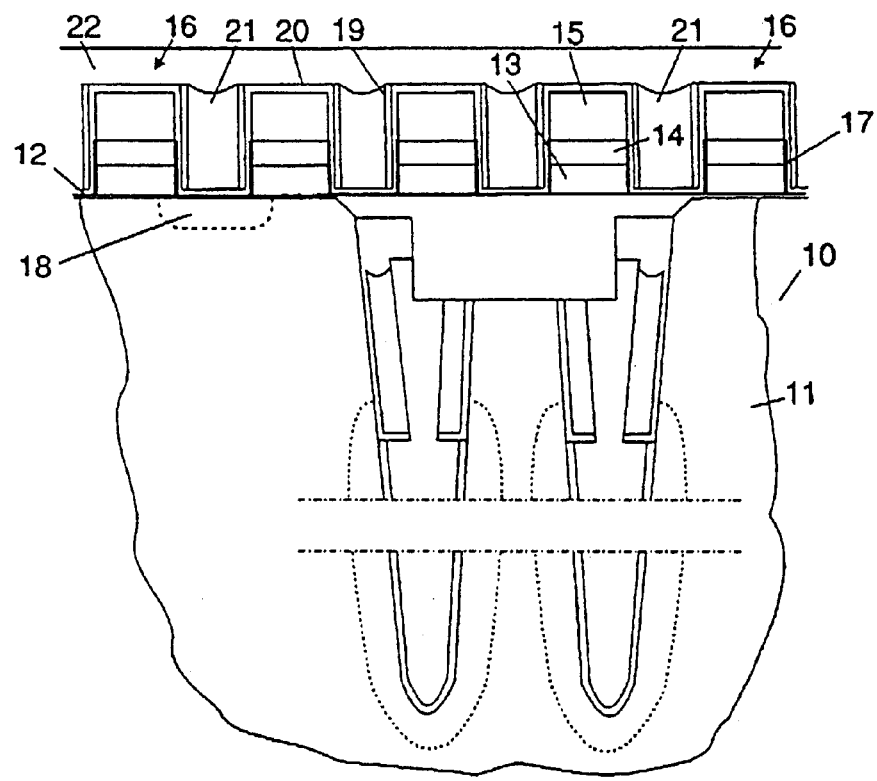

The following steps until CB dry etching process are performed the same way as described in the conventional fabrication process, including the deposition of BPSG layer 21, its planarization and the deposition of the TEOS layer 22. At this stage of the fabrication process, the structure is shown in FIG. 3C.

Figure 3D:
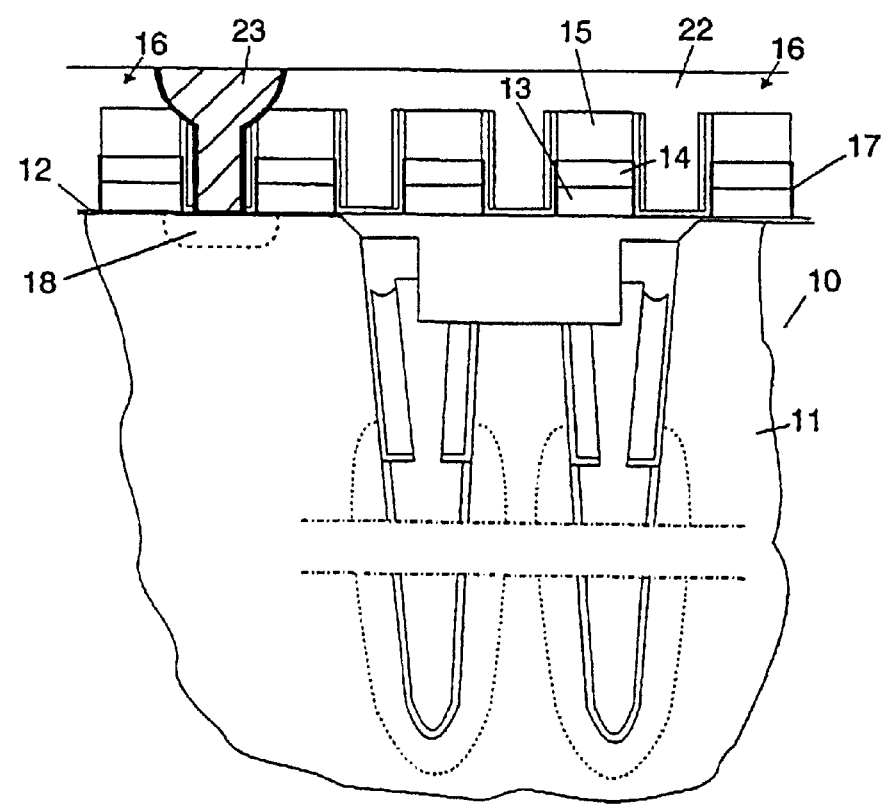

The steps of dry etching the contact hole and of filling it with tungsten are now performed in the same manner as described above. The resulting structure is shown in FIG. 3D.

Figure 4A:
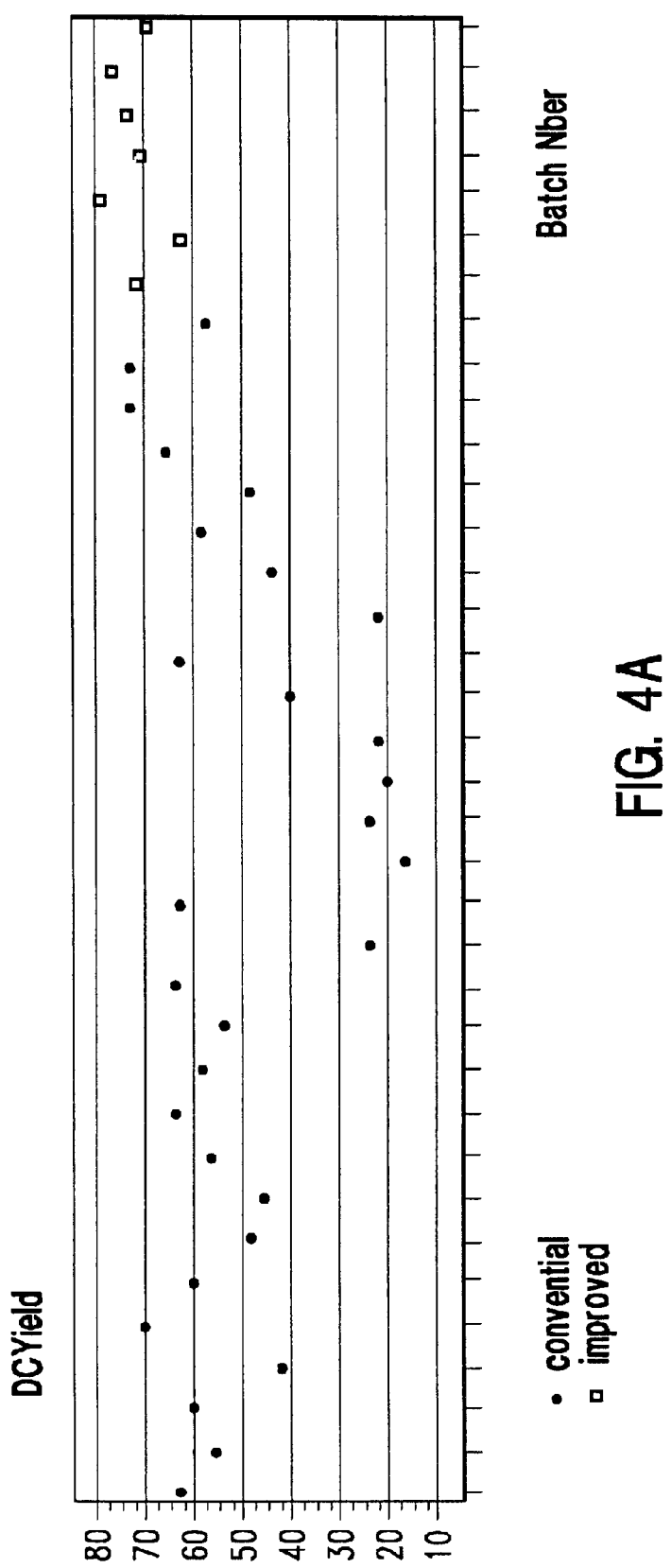
FIGS. 4A, 4B, and 4C are graphs showing different yields in the course of the wafer fabrication that have been obtained with the conventional and the improved borderless metal contact fabrication processes for different batches of wafers.
Figure 4B:
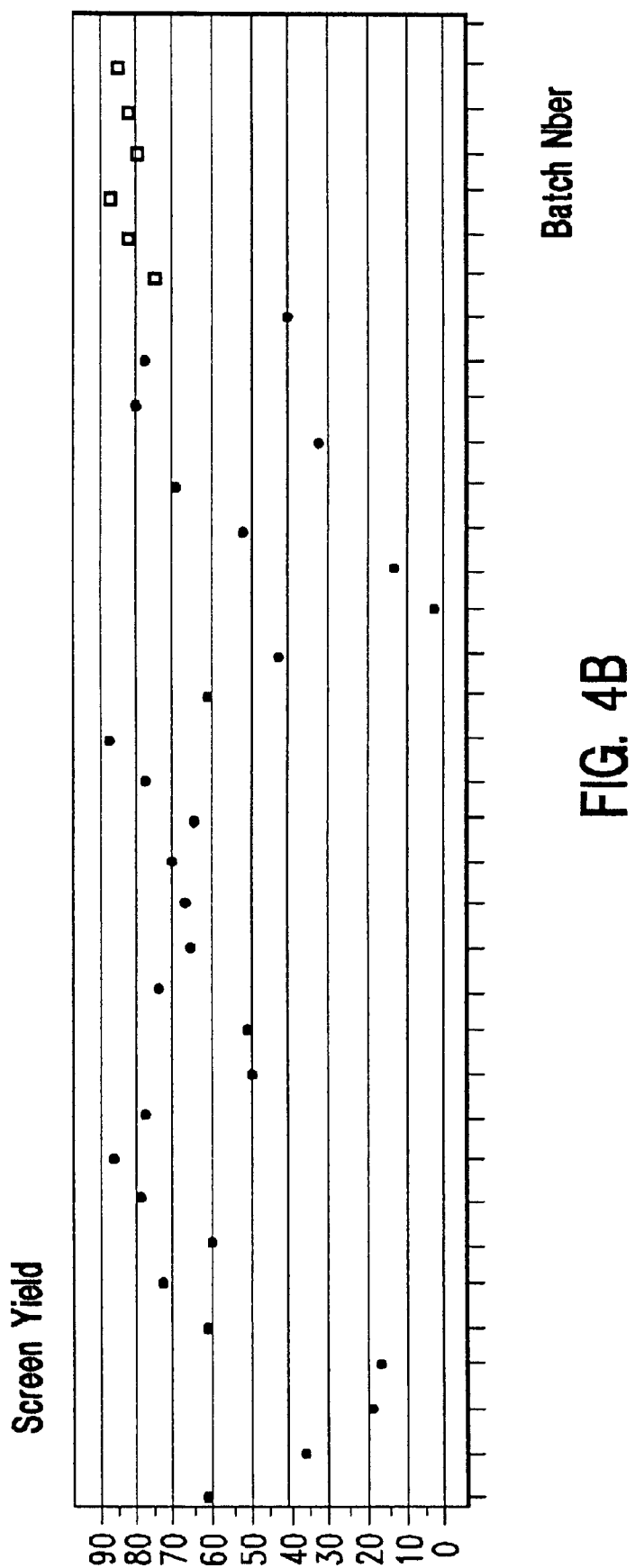
Figure 4C:
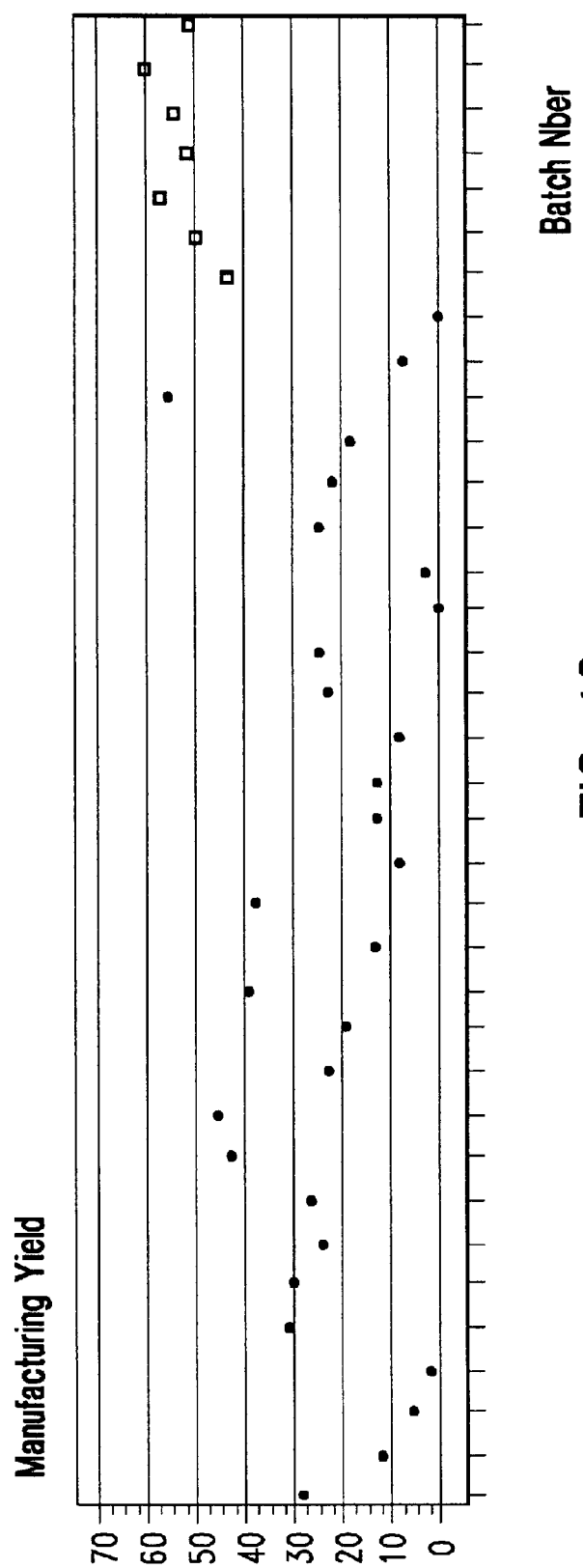

FIGS. 4A–4C are graphs showing different yields in the course of the wafer fabrication that have been obtained with the conventional and the improved borderless metal contact fabrication process for different batches of wafers.

FIG. 4A shows the direct current (DC) yield which is related to the DC current consumed by the memory array and support circuitry. As apparent in FIG. 4A, with the improved method of the present invention, the DC yield is significantly higher and has a narrower distribution range than with the conventional process. This demonstrates an important reduction of the risk of GC conductor 16/metal contact 23 electrical shorts.

FIG. 4B shows the screen yield which is related to the memory cell functional operation and thus to the number of "hard" failed cells leading to chip rejection. As apparent in FIG. 4B, with the improved method of the present invention, the screen yield is significantly higher and has a narrower distribution range than with the conventional process. This demonstrates an important reduction of the risk of diffusion region 18/metal contact 23 electrical shorts.

FIG. 4C shows the manufacturing (also referred to as the all good) yield which incorporates both the DC and screen yields and another yield labeled TSLY which is also related to the memory cell functional operation and thus to the number of "soft" failed cells. As apparent in FIG. 4B, with the improved method of the present invention, the manufacturing yield is significantly higher and has a narrower distribution range than with the conventional process. The manufacturing yield is important because it directly defines the number of good chips in the batch.

Figure 2A:
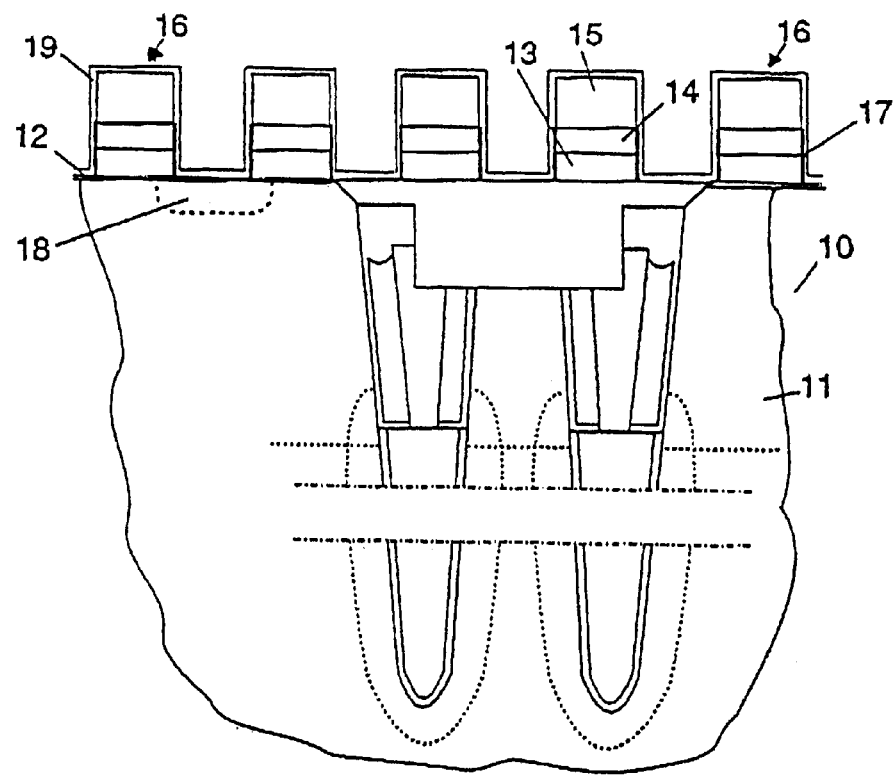
FIGS. 2A, 2B, 2C, 2D, 2E, and 2F show the structure of FIG. 1 undergoing the essential steps of a conventional borderless metal contact fabrication process.
Figure 2B:
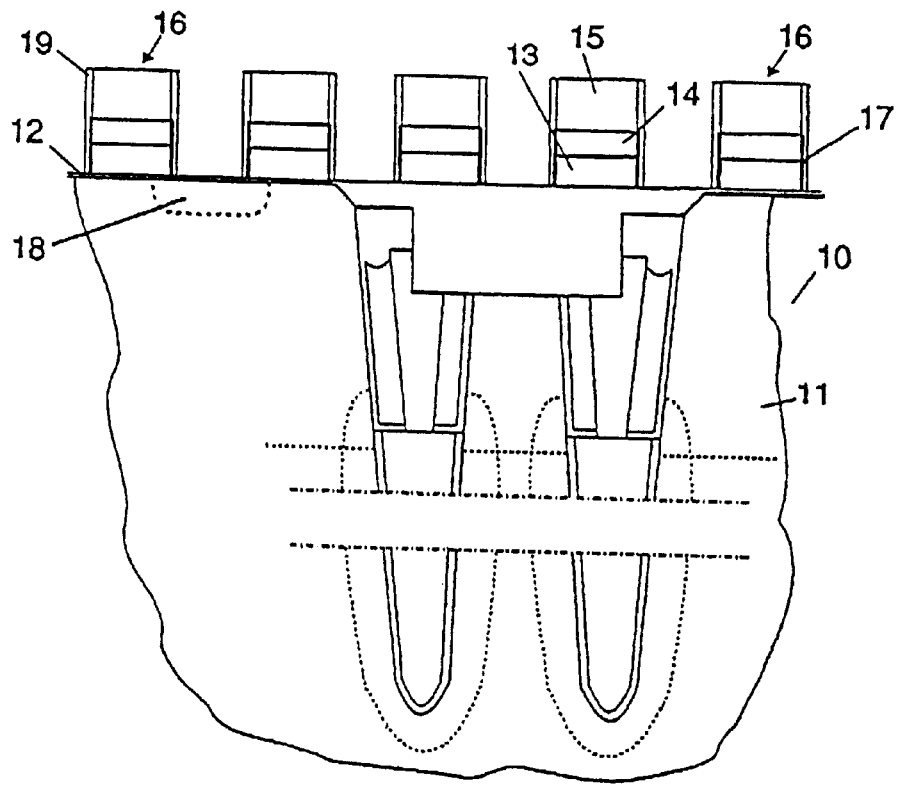
Figure 2C:
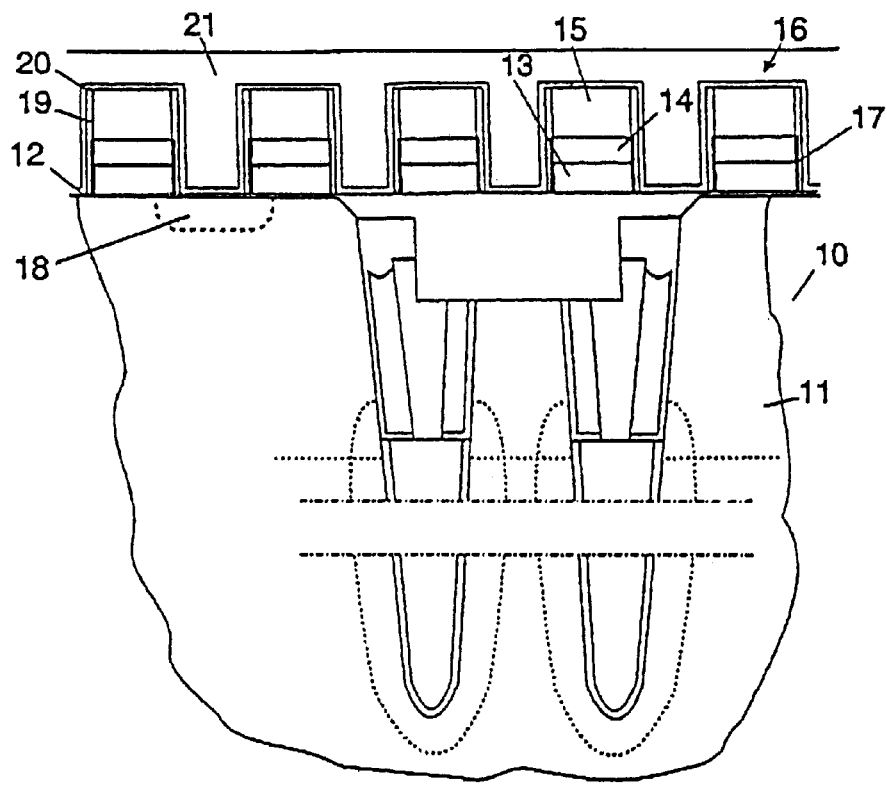
Figure 2D:
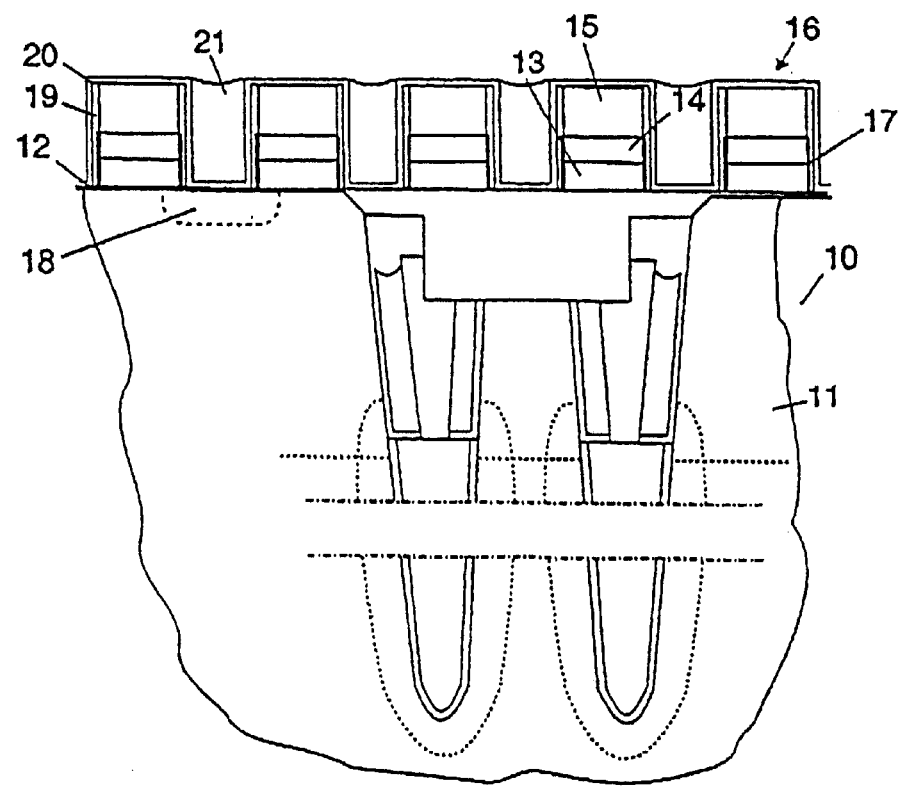
Figure 2E:
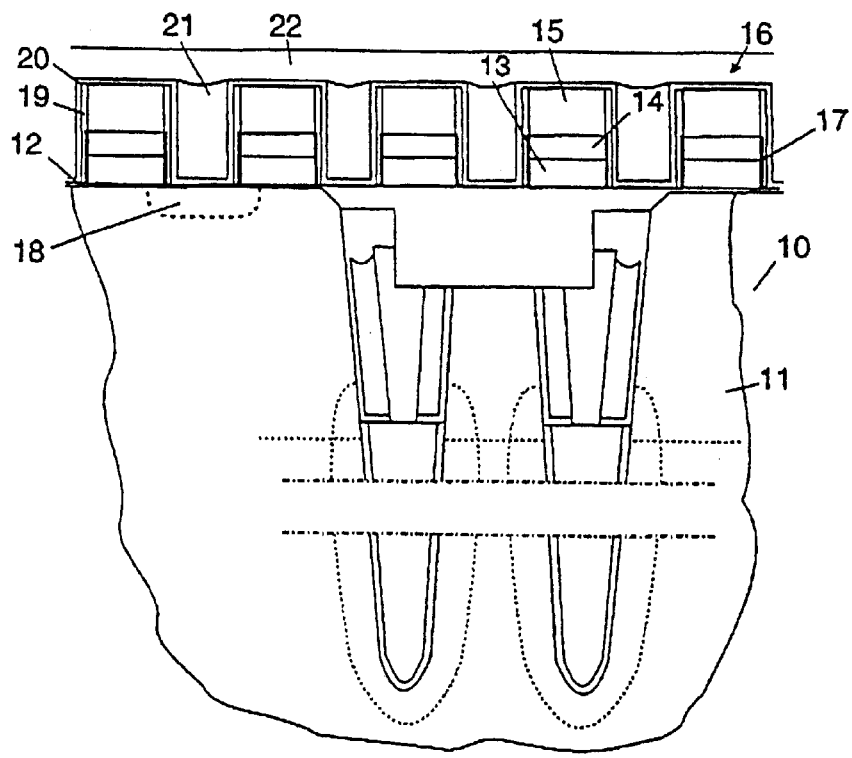
Figure 2F:
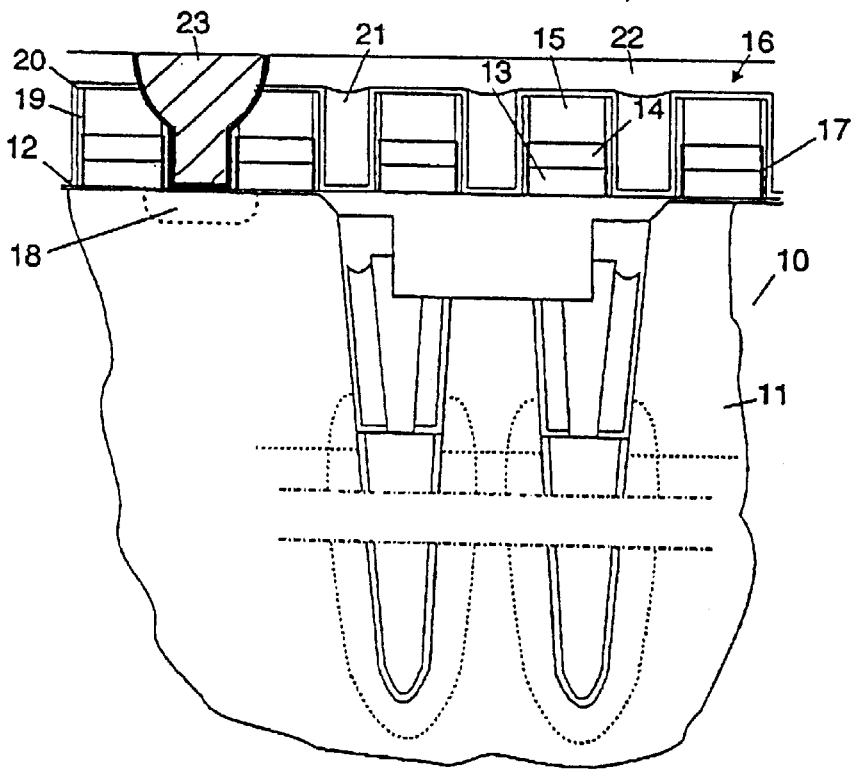

The main difference with the conventional process is that the material coating the gate conductor lines exposed during CB dry etching is $Si_3N_4$ and not oxynitride as it was before. Thanks to the high selectivity between $SiO_2$ and $Si_3N_4$ (greater than 6:1), the method of the present invention permits to guarantee absence of CB-GC electrical shorts because the thickness and total integrity of the physical barrier consisting of the oxynitride and $Si_3N_4$ layers. As a consequence, the process window of CB dry etching process is now widened and the regular controls on patterned product wafers that were performed can now be reduced. The comparison between metal contacts 23 of FIGS. 2F and 3D is illustrative in terms of profile improvement.

The improved spacer/borderless contact fabrication process has a number of advantages when compared with the conventional one. First in terms of process flow simplification. If we remind the conventional spacer/borderless contact fabrication process, it is important to remark that after $Si_3N_4$ spacer 19 dry etching, the step of thickness measurement is now suppressed. In addition the shift from a partially selective dry etch process to an essentially selective one for the $Si_3N_4$ material is essential to preserve spacer integrity.

The advantages are listed below

1. No $Si_3N_4$ cap layer 15 and $SiO_2$ gate layer 12 erosion are produced because oxynitride has been used as the etch stop material during $Si_3N_4$ spacer dry etching. $Si_3N_4$ cap layer 15 thickness non-uniformity is thus limited across the wafer before BPSG planarization. In addition, no thickness measurement is needed after $Si_3N_4$ spacer formation to evaluate $Si_3N_4$ and $SiO_2$ material losses and therefore the process flow is simplified.

2. Oxynitride layer 20 and gate oxide layer 12 thickness are preserved with the present method so that the borderless contact hole formation which is monitored by time becomes a more secure process in terms of reliability. There is no longer any electrical open between metal contact 23 and diffusion region 18 due to an insufficient etch time during CB contact hole formation.

3. On GC lines sidewall, oxynitride layer 20 is completely preserved during CB dry etch process thanks to the high selectivity of this step, so that the oxynitride and $Si_3N_4$ layer thickness forming the barrier between the polycide of the gate conductor and the metal contact 23 is maximum. Therefore, there is no longer any electrical short between metal contact 23 and GC lines 16.

As a final result, all the concerns and defects described above by reference to FIG. 2F disappear with the method of the present invention.

What is claimed is:

1. An improved method of forming the insulating spacer on the gate conductor sidewall of an IGFET comprising the steps of:
   a) providing a structure consisting of a silicon substrate having a diffusion region formed therein and gate conductor (GC) lines formed thereon isolated from the substrate by a thin $SiO_2$ gate layer;
   b) conformally depositing an oxynitride layer and a silicon nitride ($Si_3N_4$) layer in sequence onto the structure in the same deposition tool for total clusterization; and,
   c) anisotropically dry etching the $Si_3N_4$ layer with a chemistry which is $Si_3N_4$/oxynitride selective to expose the oxynitride layer between the GC lines and the upper portion thereof in a one step process to form the $Si_3N_4$ spacers.

2. The method of claim 1 wherein said step of conformally depositing the oxynitride and $Si_3N_4$ layers is performed by LPCVD.

3. The method of claim 2 wherein said oxynitride and $Si_3N_4$ are deposited at the same temperature.

4. Method for fabricating the borderless metal contact with a diffusion region in a silicon substrate comprising the steps of:
   a) providing a structure consisting of a silicon substrate having a diffusion region formed therein and gate conductor (GC) lines formed thereon isolated from the substrate by a thin $SiO_2$ gate layer;
   b) conformally depositing an oxynitride layer and a silicon nitride ($Si_3N_4$) layer in sequence onto the structure in the same deposition tool for total clusterization;
   c) anisotropically dry etching the $Si_3N_4$ spacer layer with a chemistry which is $Si_3N_4$/oxynitride selective to expose the oxynitride layer between the GC lines and the upper portion thereof in a one step process to form the $Si_3N_4$ spacers;
   d) monitoring said dry etch step with a spectrometer to use the oxynitride layer as an etch stop layer;
   e) depositing a layer of BPSG material in excess onto the structure;
   f) planarizing the BPSG material by chemical-mechanical polishing to remove the BPSG down to approximately the oxynitride layer surface on the top of the GC lines;
   g) depositing a passivating layer of TEOS $SiO_2$ onto the structure;
   h) defining a photolithography mask to expose contact hole locations;
   i) anisotropically dry etching the TEOS, BPSG, oxynitride and $SiO_2$ materials to expose the diffusion region to form the contact hole; wherein the operating conditions of the BPSG etch step ensures a high selectivity to etch the BPSG at least 6 times faster than the $Si_3N_4$ of the spacer layer; and,
   j) depositing a metal to fill the contact hole and create the borderless metal contact.

5. The method of claim 4 wherein said step of conformally depositing the oxynitride and $Si_3N_4$ layers is performed by LPCVD.

6. The method of claim 5 wherein said oxynitride and $Si_3N_4$ are deposited at the same temperature.

* * * * *